United States Patent
Cheng

(10) Patent No.: US 6,246,268 B1
(45) Date of Patent: Jun. 12, 2001

(54) CMOS INTEGRATED SIGNAL DETECTION CIRCUIT WITH HIGH EFFICIENCY AND PERFORMANCE

(75) Inventor: Yi Cheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 09/589,417

(22) Filed: Jun. 7, 2000

(51) Int. Cl.[7] .................................................. H03K 5/22
(52) U.S. Cl. ............................................. 327/65; 327/552
(58) Field of Search .................................. 327/63, 65, 66, 327/67, 77, 89, 560–563, 552

(56) References Cited

U.S. PATENT DOCUMENTS

| | | | |
|---|---|---|---|
| 4,398,154 | * 8/1983 | Lee | 327/77 |
| 4,801,827 | * 1/1989 | Metz | 327/356 |
| 5,199,049 | 3/1993 | Wilson | 375/104 |
| 5,283,483 | * 2/1994 | Laber et al. | 327/552 |
| 5,717,720 | 2/1998 | Jackson et al. | 375/316 |
| 5,940,400 | 8/1999 | Eastmond et al. | 370/445 |

* cited by examiner

*Primary Examiner*—Toan Tran
(74) *Attorney, Agent, or Firm*—George O. Saile; Stephen B. Ackerman; Eric B. Janofsky

(57) ABSTRACT

In the present invention a semiconductor integrated circuit is described to perform signal detection in a data communication system. The circuit is configured such that the capacitors used in high pass filter and a low pass filter are CMOS capacitors. The capacitors are formed from transistors where the gate is one terminal of the capacitor and the source and drain connected together form the second terminal of the capacitor. The source and drain that are connected together are connected to a voltage bias in the circuit which prevents the capacitors from being in a "floating" circuit configuration. The signal detection is done in one stage where a high pass filter is in the source of the input transistors and a low pass filter is in the drain of the input transistors. A comparator connects to the drain circuitry of the input transistors which supplies and offset voltage to the comparator. The input signal must be of a specific frequency to be conducted through the filters and of specific amplitude to overcome the offset. The simplicity requires far few devices than previous signal detectors and facilitates the ability to handle high frequency signals.

12 Claims, 4 Drawing Sheets

FIG. 1 – Prior Art

CMOS INTEGRATED SIGNAL DETECTION CIRCUIT WITH HIGH EFFICIENCY AND PERFORMANCE

BACKGROUND OF THE INVENTION

1. Field of Invention

The present invention relates to signal detection and in particular an integrated circuit signal detector for a data communication system.

2. Description of Related Art

The detection of signals at a specific frequency with a specific signal strength is often required in a data communication system. As an example, in an Ethernet system certain signals with an amplitude greater than 200 mv are required to be detected before a link between two stations can be established. It is desirable to have this detection capability implemented in an integrated circuit using typical digital circuit process steps.

In U.S. Pat. No. 5,940,400 (Eastmond et al.) a method and device is directed to provide collision presence detection in wireless intensity modulated binary coded transceivers. A measurement of the degree of correlation which exists between a transmitted signal and a received signal provides the basis for collision detection. In U.S. Pat. No. 5,717,720 (Jackson et al.) is directed to digital data receivers, methods and circuitry for differentiating between signals and data packets of varying protocols and frequencies transferred over a digital burst mode communications system. U.S. Pat. No. 5,199,049 (Wilson) is directed to a digital squelch circuit for detecting valid data signals in a burst mode communication system, e.g. a packet based LAN. A counter is started in a squelch circuit and input signals are detected at various interval of the counter. If there is an input signal transition a predetermined number of times as measured by the counter, the input signal is defined as valid.

A typical implementation of a signal detector is shown in FIG. 1. A differential input 10 is connected to a high pass filter 11. The high pass filter 11 comprising circuit elements C1, C2, R1 and R2 is connected to a first operational amplifier 12 connected in differential mode. The output of the first operational amplifier 12 is connected to a low pass filter 13 comprising circuit elements C3, C4, R3 and R4. The low pass filter 13 is further connected to a second operational amplifier 14 connected in differential mode. In the output circuitry of the second operational amplifier 14 is an offset circuit 15 comprising resistors R5 and R6 and current sources J1 and J2. The offset is determined by the current from current source J2 flowing through R6. A comparator 16 is connected to the offset circuitry 15 such that a signal from second operational amplifier 14 must be larger than the offset voltage to produce a signal at the output 17 of the comparator 16.

If the cutoff frequency of the high pass filter 11 is lower than the cutoff frequency of the low pass filter 13, then a signal at the differential input 10 with a frequency between the two cut off frequencies will produce an output from the second operational amplifier 14. If the input signal has sufficient amplitude to overcome the offset voltage produced by the offset circuitry 15, then the comparator will produce a pulse at the output 17.

A problem with the circuitry of FIG. 1 is that it is difficult to integrate the circuitry into a chip containing digital circuitry. Capacitors C1 and C2 are connected in a "floating" configuration where they are not directly connected to ground or a circuit bias. Using a CMOS integrated circuit processes it is not easy to implement these capacitors. Either special silicon wafer steps are required that are not a part of typical CMOS digital circuit process steps, or a big area is required to facilitate a metal layer to metal layer capacitors. A second problem results from the need for multiple stages requiring relatively complicated circuitry in each stage which increases the cost of design and manufacture but also has a tendency to limit the circuit performance at high frequency signals.

OBJECTS OF THE INVENTION

It is an object of the present invention to produce a signal detector suitable for use in communication systems that can detect signals at a specific frequency and having a specific strength.

It is another an object of the present invention to provide a signal detector that can be integrated into a CMOS digital integrated circuit using typical CMOS process steps and requiring a small area for implementation.

It is further an object of the present invention to provide a detection circuit with relatively few components and having minimal effect on the performance of processing high frequency signals.

SUMMARY OF THE INVENTION

In the present invention a single stage circuit is used to filter out signals of all frequencies except for an input signal with a specific frequency. The single stage circuit also produces an offset voltage to be used by a subsequent comparator circuit to determine the strength of the signal with the specific frequency. The single stage circuit comprises two transistors operating in parallel and receiving a differential signal. Each transistor has a high pass filter in the source circuitry and a low pass filter in the drain circuitry. The two filters are designed such that the cut off frequency of the high pass filter is below the cut off frequency of the low pass filter which allows a specific frequency from the input to be amplified through to the output. The output is derived in the drain circuitry of the two transistors in such a way that an offset voltage is presented to a comparator connected to the output. The offset voltage allows the comparator to detect a signal of a specific frequency and at a specific strength at the output of the two transistors which is higher than the offset voltage The low pass and high pass filters are formed by using semiconductor capacitors. The capacitors are formed from CMOS transistors where the source and drain are connected together and the capacitance is formed from the gate to source. The gate of the CMOS capacitors is connected to signal nodes and the drain-source connection of the capacitors is connected to the source bias of the single stage circuitry.

BRIEF DESCRIPTION OF THE DRAWINGS

This invention will be described with reference to the accompanying drawings, wherein.

DETAILED DESCRIPTION OF THE PREFERRED EMBODIMENT

Figure 2:
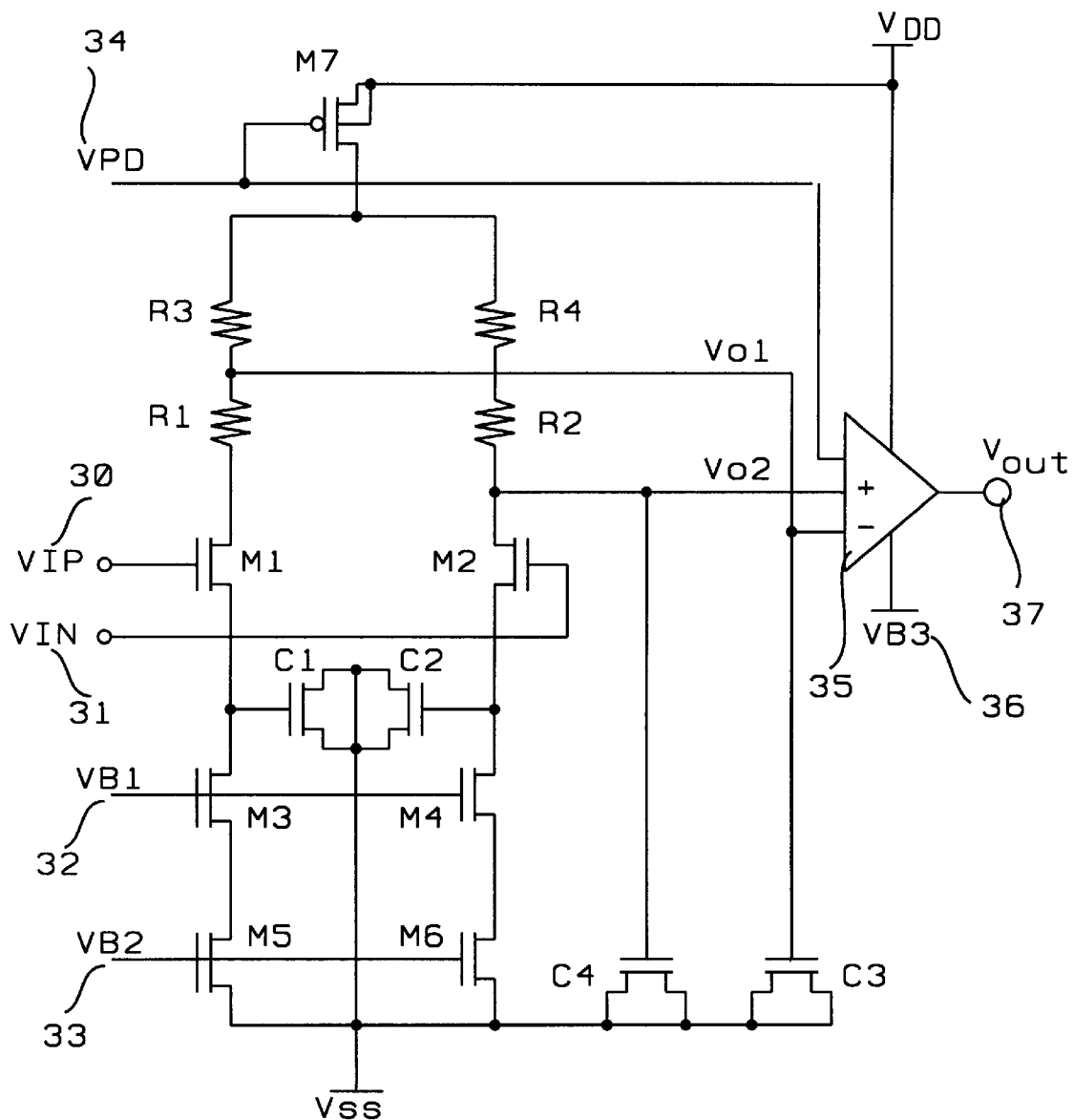
FIG. 2 is a circuit diagram of the signal detector circuit of the present invention.

In FIG. 2 is shown a circuit diagram of the circuit of the present invention. The invention provides a signal detector that can detect signals at a specific frequency and having a specific strength. In FIG. 2, the output 37 produces a pulse when an input signal at VIP 30 and VIN 31 are at a specific frequency and above a specific differential amplitude with respect to each other. The specific frequency is a frequency that falls within the bandpass of both a high pass filter and a low pass filter in the circuit of the invention.

As shown in FIG. 2, a differential input signal comprising two signals, VIP 30 and VIN 31, is connected to a pair of transistors, M1 and M2, operating in parallel as a single circuit stage. The source of transistor M1 is connected to transistor M3 which is further connected to transistor M5. Transistors M3 and M5 operate as constant current sources controlled by their input voltages VB1 32 and VB2 33. The source of transistor M5 is connected to a circuit bias $V_{SS}$. Also connected to the source of transistor M1 is the gate of a transistor C1 that forms a capacitance between its gate and source. The source and drain of transistor C1 are connected together and further connected to circuit bias $V_{SS}$. The gate to source capacitance of transistor C1 forms a high pass filter in the source circuitry of transistor M1. The source of transistor M2 is connected to transistor M4 which is further connected to transistor M6. Transistors M4 and M6 operate as constant current sources controlled by their input voltages VB1 32 and VB2 33. The source of transistor M6 is connected to a circuit bias $V_{SS}$. Also connected to the source of transistor M2 is the gate of a transistor C2 that forms a capacitance between its gate and source. The source and drain of transistor C2 are connected together and further connected to circuit bias $V_{SS}$. The gate to source capacitance of transistor C2 forms a high pass filter in the source circuitry of transistor M2.

Continuing to refer to FIG. 2, the drain of transistor M1 is connected to a resistor R1 which is further connected to a resistor R3 and the gate of a transistor C3. The juncture between R1, R3 and C3 forms a circuit output from the first half of the signal detection circuit and produces a detection circuit output signal, Vo1. Transistor C3 is used to produce a semiconductor capacitor between its gate and source. The source and drain are connected together and further connected to circuit bias Vss. The gate to source capacitance of transistor C3 in conjunction with R3 forms a low pass filter in the drain circuitry of transistor M1. Resistor R3 is further connected to a bias transistor M7 which is used to provide power from $V_{DD}$ to the signal detection circuit under the control of the voltage VPD 34. The voltage VPD 34 is used to power off the signal detection circuit by disconnecting the voltage $V_{DD}$ from resistors R3 and R4. The drain of transistor M2 is connected to a resistor R2 which is further connected to a resistor R4. Resistor R4 is further connected to transistor M7. The gate of a transistor C4 used to produce a semiconductor capacitor is connected to the juncture between resistors R2 and the drain of transistor M2. The source and drain of the transistor capacitor C4 is connected to circuit bias Vss. The gate to source capacitance of transistor C4 in conjunction with R2 and R4 forms a low pass filter in the drain circuitry of transistor M2. The connection between R2, C4 and the drain of M2 forms a circuit output from the second half of the signal detection circuit and produces a signal detection circuit output signal, Vo2.

Continuing to refer to FIG. 2, the "+" signal input of a comparator 35 is connected the gate of C4 and the juncture between resistor R2 and the drain of transistor M2, and the "−" signal input to comparator 35 is connected to the gate of transistor C3 and the juncture of resistors R1 and R3. A voltage, VPD 34, is connected to the comparator 35 to allow the comparator to be turned off when not in use. The comparator is connected to voltage bias $V_{DD}$ and voltage bias VB3 36. The output 37 of the comparator 35 produces a pulse when the input signal at VIP 30 and VIN 31 are at a specific frequency and above a specific differential amplitude with respect to each other. The specific frequency is a frequency that falls within the bandpass of both the high pass filter in the source circuitry of transistors M1 and M2 and the low pass filter in the drain circuitry of transistors M1 and M2.

Figure 1:
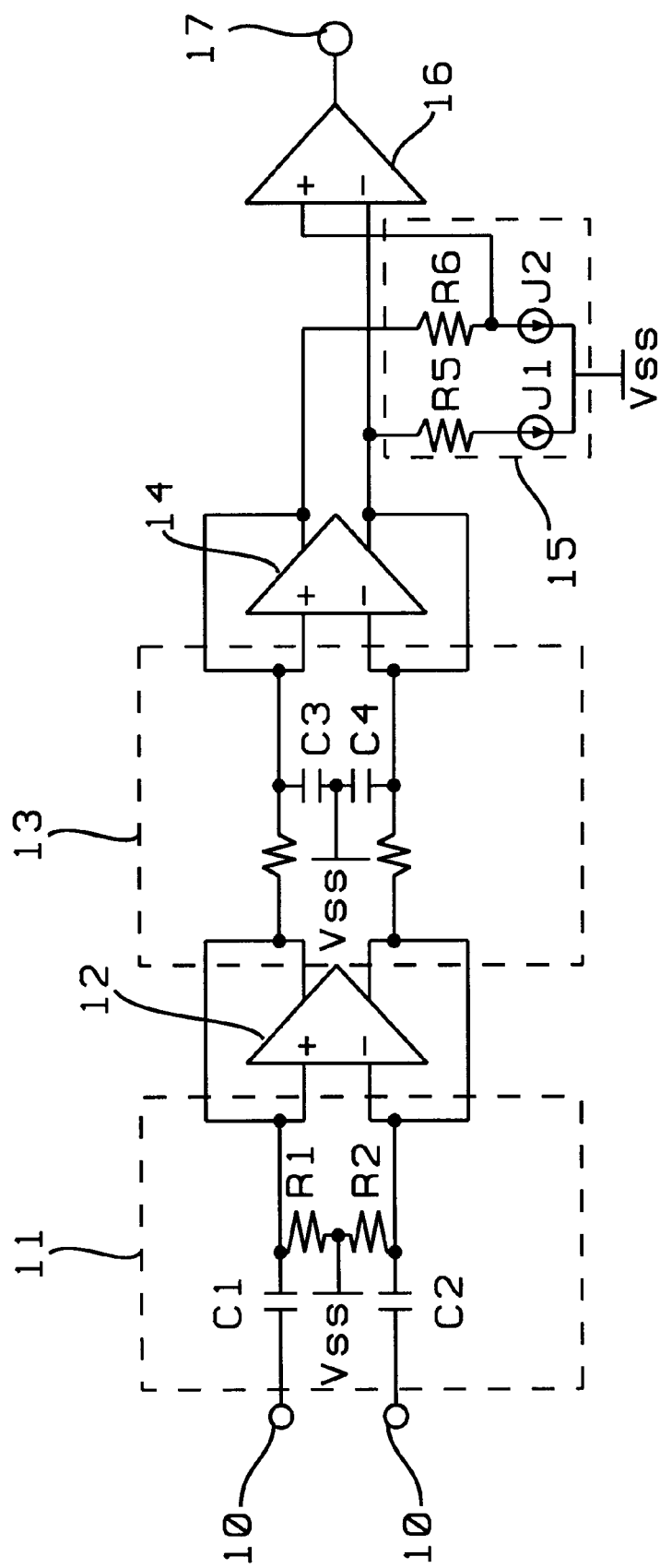
FIG. 1 is a circuit diagram of a conventional signal detection circuit.

Continuing to refer to FIG. 2, a Laplace transform analysis shows that the present invention produces the same results as that of the prior art. The current flowing in one of the two transistors, M1, of the single stage circuitry is Igm1=Vgs1×Gm1, where Vgs1 is the gate to source voltage and Gm1 is the transconductance of the transistor M1. The gate to source voltage in terms of an input voltage, VIP, connected to the gate of M1 is Vgs1=VIP−Igm1×(S×C1), where C1 is a semiconductor capacitor in the source of the transistor M1. The output voltage, Vo1, of the transistor M1 in terms of the transistor current is Vo1=−Igm1/(S×C3+1/R3), where R3 is a resistor in the drain circuitry of M1, and C3 is a semiconductor capacitor in the drain circuitry of M1. Substituting for Igm1 yields Vo1/VIP=K1×S/((S+1/(R3×C3))×(S+Gm1/C1)), where K1=−Gm1/C3 The transfer function Vo1/VIN provides the same results as that obtained for the circuit of prior art shown in FIG. 1.

Continuing to refer to FIG. 2, a similar Laplace transform analysis result can be obtained for the transfer function for transistor M2. The current flowing in transistor, M2, is Igm2=Vgs2×Gm2, where Vgs2 is the gate to source voltage and Gm2 is the transconductance of the transistor M2. The gate to source voltage in terms of an input voltage, VIN, connected to the gate of M2 is Vgs2=VIN−Igm2×(S×C2), where C2 is a semiconductor capacitor in the source of transistor M2. The output voltage, Vo2, of transistor M2 in terms of the transistor current is Vo2=−Igm2/(S×C4+1/R), where R=R2+R4 is the resistance of the resistors in the drain circuitry of transistor M2, and C4 is the semiconductor capacitance in the drain circuitry of M2. Substituting for Igm2 yields Vo2/VIN=K2×S/((S+1/(R×C4))×(S+Gm2/C2)), where K2=−Gm2/C4 The transfer function Vo2/VIN provides the same results as that obtained for transistor M1 and the circuit of prior art shown in FIG. 1. The time constant R×C4 for the drain circuitry for transistor M2 is designed to be the same as the time constant R3×C3 for the drain circuitry for transistor M1. The amplitude of "+" and "−" inputs of the comparator 35 can be made to be the same by adjusting the drain circuitry of M1 and M2, but since the comparator inputs are differential, it is not necessary that the amplitude of the "+" and "−" input signals to the comparator have an identical amplitude.

Figure 3:
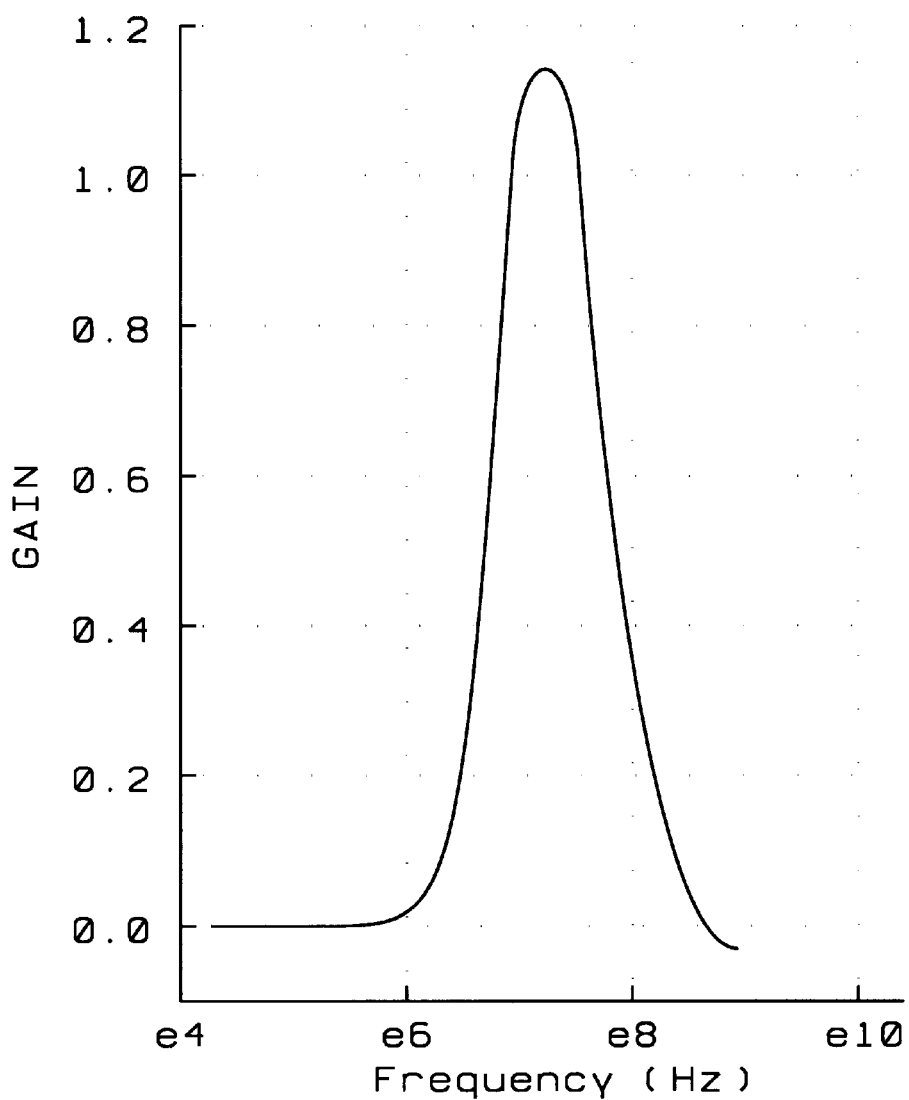
FIG. 3 shows a circuit simulation of the voltage gain versus frequency for the circuit of the present invention.

Referring to FIG. 3, a gain versus frequency plot is shown obtained from circuit simulation for the signal detection circuit of the present invention. The vertical axis is gain and the horizontal axis is a logarithmic scale of frequency where $e4=10^4$, $e6=10^6$, $e8=10^8$ and $e10=10^{10}$. For this particular plot the curve peaks at approximately 31 MHz. Output signals resulting from input signals above or below the center frequency are substantially attenuated as compared to a center frequency of approximately 31 MHz. Other center frequencies can be obtained by changing the cutoff frequency of the high pass filters in the source circuitry of transistors M1 and M2 and the cutoff frequency of the low pass filters in the drain circuitry of transistors M1 and M2.

Figure 4A:
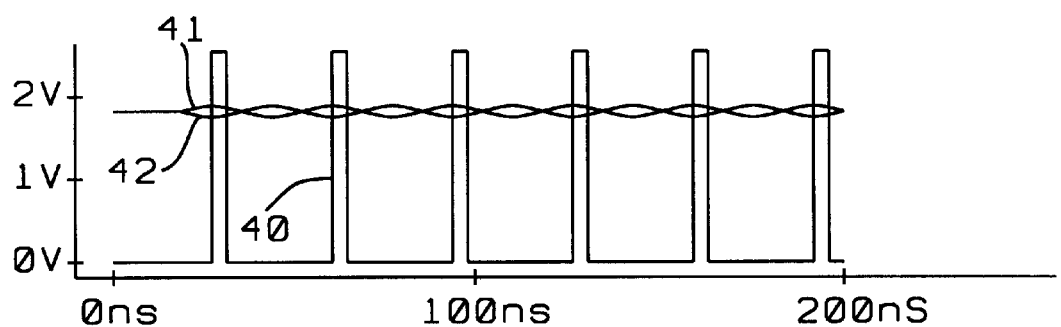
FIGS. 4a–c show the input and output results from circuit simulation of the circuit of the present invention with inputs being sinusoidal waveforms of different frequencies and having the same amplitude.

In FIG. 4a is shown results of an output voltage 40 at the circuit output 37 with input signals 41 and 42 at circuit inputs 30 and 31. An approximate +1.8V offset voltage is applied to the inputs VIP and VIN along with the sinusoidal signals 41 and 42. The input signals 41 and 42 are of a specific frequency to pass through the high pass filters in the source circuitry of transistors M1 and M2 and to pass through the low pass filters in the drain circuitry of transistors M1 and M2. The input signals 41 and 42 have an amplitude sufficient to create a differential signal at the input to the comparator 35 sufficient to cause the comparator 35 to switch from a low state to a high state as shown with the output waveform 40. The output waveform switches from a low voltage state to a high voltage state when the input sinusoidal signal 41 is high and input sinusoidal signal 42 is low. The width of the pulses in the output signal is determined by the amount of time that the differential voltage at the "+" and "−" inputs to the comparator 35, caused by input signals 41 and 42, is greater than the minimum differential voltage needed to cause the output of the comparator to switch from a low voltage state to a high voltage state.

Figure 4B:
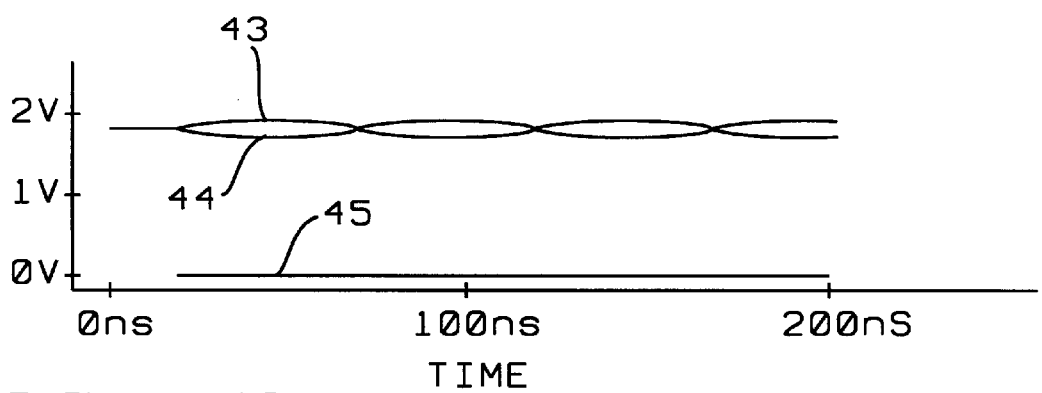
Figure 4C:
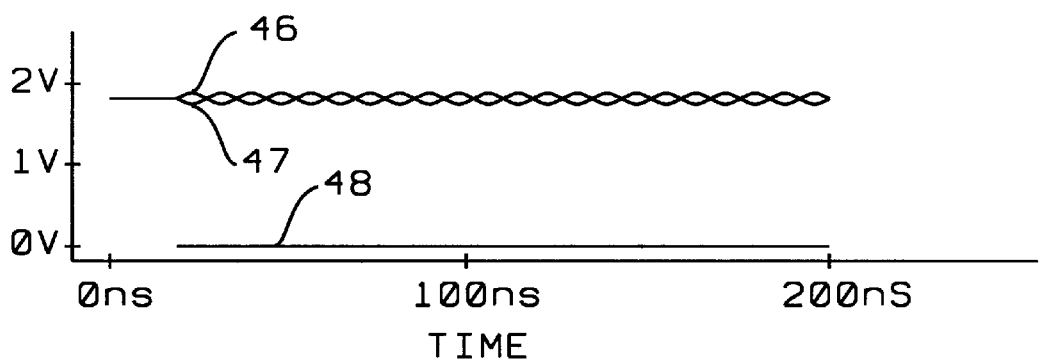

In FIG. 4b the amplitude of the two input signals 43 and 44, applied to the inputs VIP and VIN, are the same as signals 41 and 42, but the frequency of the two input signals 43 and 44 is lower than the frequency of the two input signals 41 and 42 of FIG. 4a. The output voltage 45 of the comparator 35 remains in a low voltage state because the lower frequency input signals 43 and 44 cannot get through the high pass filter with sufficient amplitude to produce a differential voltage at the input of the comparator 35 that is sufficient to switch the output of the comparator 35 from a low voltage state to a high voltage state. In FIG. 4c amplitude of the two input signals 46 and 47, applied to the inputs VIP and VIN, are the same as signals 41 and 42, but the frequency of the two input signals 46 and 47 is higher than the frequency of the two input signals 41 and 42 of FIG. 4a. The output voltage 48 of the comparator 35 remains in a low voltage state because the higher frequency input signals 46 and 47 cannot get through the low pass filter with sufficient amplitude to produce a differential voltage at the input of the comparator 35 that is sufficient to switch the output of the comparator 35 from a low voltage state to a high voltage state.

Figure 5:
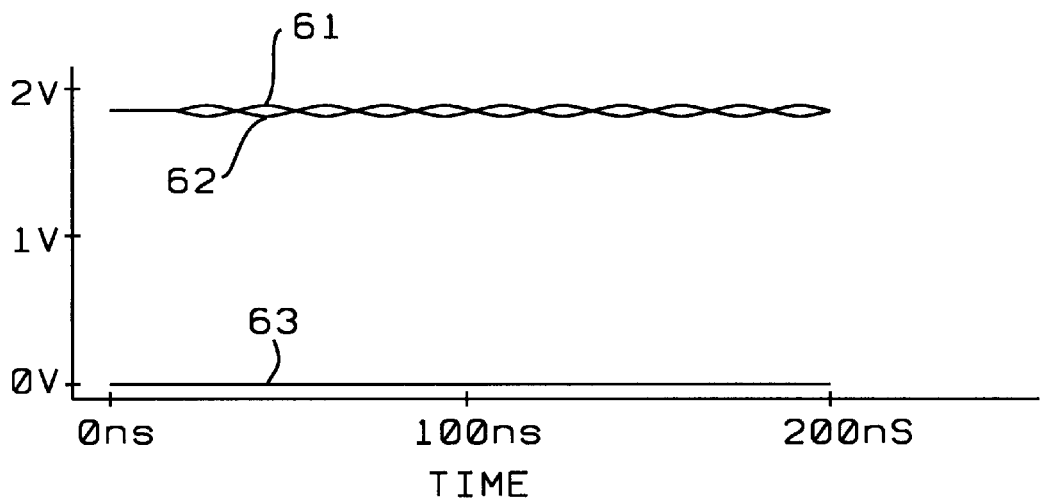
FIG. 5 shows the input and output results from circuit simulation of the circuit of the present invention with low amplitude inputs at a frequency within the bandpass of both the low pass and high pass filters.

In FIG. 5 is shown input signals 61 and 62 which are connected to VIP and VIN of the signal detection circuit shown in FIG. 2. The frequency of the two input signals 61 and 62 are the same frequency as signals 41 and 42 shown in FIG. 4a, but the differential amplitude of signals 61 and 62 smaller than the differential amplitude of signals 41 and 42. This is emphasized by the signals appearing to be the same amplitude as signals 41 and 42, but on a magnified vertical scale in FIG. 5. The two input signals 61 and 62, although at a proper frequency to pass through the low pass filters in the drain circuitry of transistors M1 and M2 and the high pass filters in the source circuitry of transistors M1 and M2, do not have a sufficient differential voltage at the input to the comparator 35 to cause the output signal 63 of the comparator 35 to switch from a low voltage state to a high voltage state.

While the invention has been particularly shown and described with reference to preferred embodiments thereof, it will be understood by those skilled in the art that various changes in form and details may be made without departing from the spirit and scope of the invention.

What is claimed is:

1. A signal detection circuit, comprising
   a) a differential amplifier having a drain portion, a source portion, a differential input and a differential output;
   b) a high pass filter in communication with said source portion;
   c) a low pass filter in communication with said drain portion configured to produce an offset voltage at said differential output; and
   d) a comparator in communication with said differential output.

2. The circuit of claim 1, wherein said high pass filter has a cutoff frequency below a cutoff frequency of said low pass filter such that an input signal applied to said differential amplifier having a predetermined frequency is amplified by said differential amplifier.

3. The circuit of claim 1, further comprising a pair of current sources in communication with the source portion, wherein said high pass filter comprises a pair of MOS transistors, wherein a capacitance of said high pass filter comprises gate to source capacitance of said pair of MOS transistors.

4. The circuit of claim 1, further comprising a resistance in communications with said drain portion, wherein said low pass filter comprises a pair of MOS transistors, wherein a capacitance of said low pass filter comprises gate to source capacitance of said pair of MOS transistors, wherein said gate is in communication with said resistance.

5. The circuit of claim 1, further comprising first and second resistances, and a source for voltage, wherein said differential amplifier comprises first and second MOS transistors, wherein said first resistance is in communication with said drain of said first transistor and said source for voltage and said second resistance is in communication with drain of said second transistor and said source for voltage, wherein said output portion is in communication with said first resistance and said drain of said second transistor.

6. The circuit of claim 1, wherein said differential amplifier comprises a MOS differential amplifier.

7. A signal detection circuit, comprising:
   a) differential amplifier means for differentially amplifying an input signal, said differential amplifier means having a drain portion, a source portion, a differential input, and a differential output;
   b) high pass filter means for high pass filtering the input signal, said high pass filter means being in communication with said source portion;
   c) low pass filter means for low pass filtering differentially amplified signal by said differential amplifier means and for producing an offset voltage at said differential output; and
   d) comparator means for comparing the differentially amplified signal low pass filtered by said low pass filter means.

8. The circuit of claim 7, wherein said high pass filter means has a cutoff frequency below a cutoff frequency of said low pass filter means such that an input signal applied to said differential amplifier means having a predetermined frequency is amplified by said differential amplifier means.

9. The circuit of claim 7, further comprising a pair of current sources means for providing current in communication with the source portion, wherein said high pass filter means comprises a pair of MOS transistors, wherein a capacitance of said high pass filter means comprises gate to source capacitance of said pair of MOS transistors.

10. The circuit of claim 7, further comprising a resistance means for providing a resistance in communications with said drain portion, wherein said low pass filter means comprises a pair of MOS transistors, wherein a capacitance of said low pass filter means comprises gate to source capacitance of said pair of MOS transistors, wherein said gate is in communication with said resistance means.

11. The circuit of claim 7, further comprising first and second resistance means for providing a resistance, and a source means for providing a voltage, wherein said differential amplifier means comprises first and second MOS transistors, wherein said first resistance means is in communication with a drain of said first transistor and said source means and said second resistance means is in communication with a drain of said second transistor and said source means, wherein said output portion is in communication with said first resistance means and said drain of said second transistor.

12. The circuit of claim 7, wherein said differential amplifier means comprises a MOS differential amplifier.

* * * * *